(12) United States Patent
Denney, III

(10) Patent No.: US 7,781,917 B2
(45) Date of Patent: Aug. 24, 2010

(54) AC VOLTAGE CONDITIONER

(76) Inventor: Theodore W. Denney, III, 17401 Armstrong Ave., Irvine, CA (US) 92614

( * ) Notice: Subject to any disclaimer, the term of this patent is extended or adjusted under 35 U.S.C. 154(b) by 170 days.

(21) Appl. No.: 11/998,001

(22) Filed: Nov. 29, 2007

(65) Prior Publication Data

US 2009/0140580 A1 Jun. 4, 2009

(51) Int. Cl.
*H01F 27/42* (2006.01)
*H01F 37/00* (2006.01)
*H01F 38/00* (2006.01)

(52) U.S. Cl. .................................. 307/104
(58) Field of Classification Search ............. 307/91, 307/104, 105
See application file for complete search history.

(56) References Cited

U.S. PATENT DOCUMENTS 6,603,646 B2 * 8/2003 Anthony et al. .............. 361/56

\* cited by examiner

*Primary Examiner*—Albert W Paladini
*Assistant Examiner*—Carlos Amaya
(74) *Attorney, Agent, or Firm*—Morland C. Fischer

(57) ABSTRACT

An AC voltage conditioner to be connected between a source of AC line voltage or non-linear voltage and one or more AC-powered devices (e.g., audio/video, medical and scientific equipment) to improve the performance of the devices by reducing the effects of interference and distortion often caused by an AC electromagnetic field or radio frequency interference in the vicinity of the devices. A pair of AC current conducting plates are respectively electrically connected between positive and negative output terminals of the AC line voltage source and positive and negative input terminals of each AC-powered device. The pair of AC current conducting plates are interposed between and separated from three DC current carrying plates. The DC current carrying plates are connected in electrical parallel with one another between positive and negative output terminals of a DC voltage generator. DC currents flowing through the DC current carrying plates from the DC voltage generator cause respective DC electromagnetic fields to surround the AC current carrying plates. Therefore, the AC currents flowing through the AC current carrying plates of the AC voltage conditioner will pass through the DC electromagnetic fields ahead of each AC-powered device.

17 Claims, 4 Drawing Sheets

AC VOLTAGE CONDITIONER

BACKGROUND OF THE INVENTION

1. Field of the Invention

This invention relates to an AC voltage conditioner to be connected between a source of AC line voltage (e.g., that available at a conventional electrical wall receptacle or other high voltage electrical source) or any other non-linear (i.e., variable) voltage source and one or more AC-powered devices, such as, for example, certain audio/visual, medical and scientific equipment. The AC voltage conditioner of this invention reduces the effects of interference and distortion caused by an electromagnetic field and radio frequency interference that is known to adversely affect performance of the AC-powered devices.

2. Background Art

Many electrical devices are powered by an AC voltage that is available by plugging the power cords of the electrical devices into electrical wall receptacles such as those common to a home or business. The operation of certain sensitive electrical devices is known to be negatively impacted by an electromagnetic field and/or radio frequency interference that is generated as an AC current travels through the power cord or data cable of the device. By way of but one example, a plasma-screen television is undesirably susceptible to interference and distortion when located in the vicinity of an electromagnetic field and/or radio frequency interference like that generated near the wall receptacle and present in the AC signal being carried along the power cord. As a consequence of the foregoing, the picture displayed by the television may not be as sharp as desired. In another example, sound amplifying and reproduction equipment is known to be influenced by an electromagnetic field and radio frequency interference, such that the sound provided to the listener lacks full range and clarity.

Accordingly, it would be desirable to reduce the negative effects caused by electromagnetic fields and radio frequency interference on sensitive AC-powered devices which are located within such fields or when the electromagnetic fields and interference contaminate the AC line signal so that the operating characteristics of the devices can be improved.

SUMMARY OF THE INVENTION

In general terms, an AC voltage conditioner is disclosed to be connected between a source of AC line voltage (e.g., a 120 volt supply typically available at an electrical wall receptacle) or any other non-linear (i.e., variable) voltage source and one or more AC-powered devices, including audio/visual, medical and scientific equipment. The AC voltage conditioner includes a stack of electrically-conductive DC and AC current carrying plates that are sandwiched between top and bottom clamping plates or within a multi-layer circuit board without the use of clamping plates. For relatively small AC-powered devices, the AC voltage conditioner is mounted by means of the clamping plates within a non-metallic, non-conductive chassis. The AC line voltage is supplied to an input of the chassis, and the power cord of an AC-powered device is connected (i.e., plugged into) an output of the chassis. For some AC-powered devices, the chassis may be eliminated, in which case the AC voltage conditioner is simply located inside the housing of the device. A DC voltage generator is electrically connected to the AC voltage conditioner to supply a DC current through each of the DC current plates thereof. The DC voltage generated may be located either inside or outside of the chassis used to enclose the AC voltage conditioner.

According to a preferred, high-current embodiment, the AC voltage conditioner includes a stack of two AC current plates and three DC current plates that are arranged in an alternating relationship one after the other. A non-conducting (e.g., Teflon) sheet or a similar electrical insulator is interposed between each pair of adjacent DC and AC current plates. Therefore, each pair of adjacent current plates will be separated from one another by an insulator. In the assembled current plate relationship, a first of the AC current plates is connected between one side of the source of AC input voltage and one pin of the plug of the power cord of the AC-powered device. The second of the AC current plates is connected between the opposite side of the source of AC input voltage and a second pin of the plug of the power cord of the AC-powered device. The three DC current plates are connected in electrical parallel with one another between one (e.g., positive) terminal of the DC voltage generator and a common electrical junction. A DC current path is established through each of the parallel connected DC current plates by way of the second (e.g., negative) terminal of the DC voltage generator, an electrical impedance, and the common electrical junction at which each of the DC current plates is interconnected with one another.

In an alternate preferred embodiment for the AC voltage conditioner, an AC ground plate is connected between a ground terminal of the source of AC input voltage and a ground pin of the power cord of the AC-powered device. In this case, the AC voltage conditioner includes a stack of two AC current plates, four DC current plates, and the AC ground plate. In the assembled relationship, each of the AC current plates and the AC ground plate lies between a pair of adjacent DC current plates.

In operation, an AC current flows through the AC current plates to respective pins of the plug of the power cord of the AC-powered device. Such AC current passes through a DC electromagnetic field that is created by a DC current flowing through each of the parallel connected DC current plates. It has been found that the effect of passing an AC or non-linear current through a DC electromagnetic field advantageously reduces the negative effects of interference and distortion created by an AC electromagnetic field in the vicinity of an electrical wall receptacle and along the power cord of the AC-powered device connected to the AC voltage conditioner so as to improve the performance of the device.

DESCRIPTION OF THE PREFERRED EMBODIMENT

Figure 1:
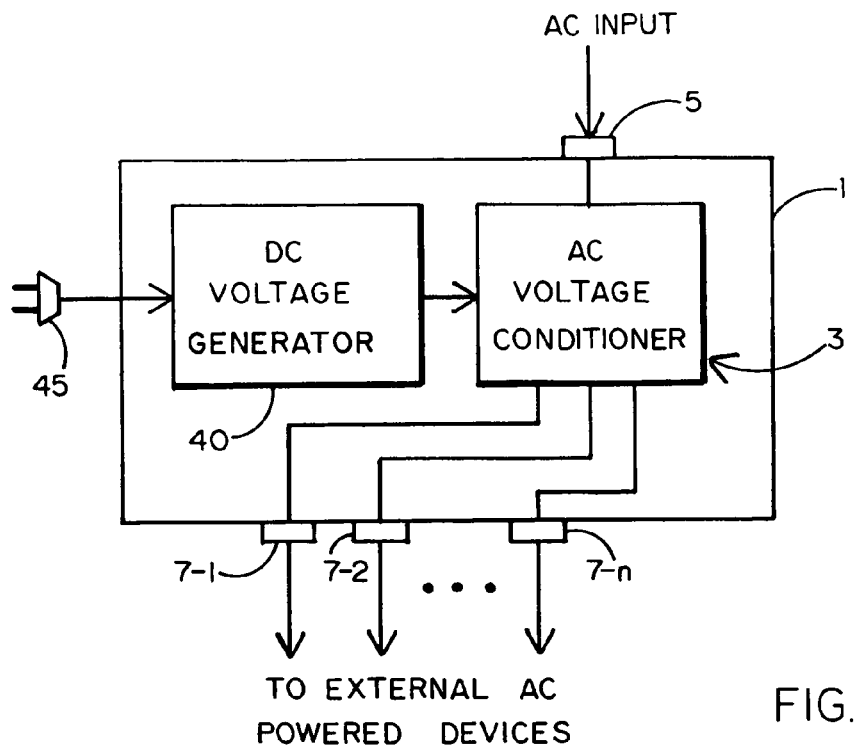
FIG. 1 represents the AC voltage conditioner according to a preferred embodiment of this invention surrounded by a chassis and connected between a source of AC input voltage and one or more external AC-powered devices.

FIG. 1 of the drawings shows a chassis 1 or similar protective housing in which an AC voltage conditioner 3 according to a preferred high current embodiment of the present invention is enclosed. As will be explained in greater detail when referring to FIGS. 2-4, the AC voltage conditioner has been found uniquely adapted to condition an AC line voltage so that the performance of external electrical devices which are powered by the conditioned AC voltage will be improved. A DC voltage generator 40 is located within the chassis 1 to supply a DC voltage to the AC voltage conditioner 3 for a purpose that will soon be explained. However, the DC voltage generator 40 may also be located externally to chassis 1. The DC voltage generator 40 may be a battery supply or an AC-to-DC voltage converter that is adapted to receive an AC voltage by means of a suitable electrical connection, such as that known commercially as a Wall Wart 45, or the like.

The chassis 1 surrounding AC voltage conditioner 3 is shown having a single input terminal 5 and an output having a plurality of output terminals 7-1, 7-2, . . . , 7-n. The input terminal 5 to chassis 1 receives an AC line voltage such as, for example, a 120 volt AC signal typically available from an electrical wall receptacle of the kind usually found at a residential dwelling or commercial building. The output terminals 7-1, 7-2, . . . 7-n of chassis 1 supply a conditioned AC voltage to each one of a corresponding plurality of AC-powered devices that are susceptible to electrical interference and distortion caused by a nearby AC electromagnetic field which is known to adversely affect the normal operation of the devices. By way of example only, the usual power cords associated with audio and visual equipment such as, for example, an audio amplifier, pre-amplifier, plasma-screen television, sound processors, a radio, CD/DVD players, and the like, are connected to respective output terminals 7-1, 7-2, . . . 7-n of the chassis 1. Other electromagnetic-field sensitive devices including those found in a hospital emergency room and those used for scientific measuring and testing purposes can be "plugged" into the output terminals of chassis 1 to achieve improved performance.

Although the chassis 1 is shown in FIG. 1 with an output having a plurality of output terminals 7-1, 7-2, . . . 7-n, it is to be understood that the AC voltage conditioner 3 surrounded by chassis 1 may be a dedicated device that has only a single output terminal 7 to supply a conditioned AC voltage to a single AC-powered device. What is more, to conserve space, the AC voltage conditioner 3 and DC voltage generator 40 can may be located internally of the housings of large AC-powered devices, such that the chassis 1 may be eliminated. In either case, the AC voltage conditioner 3 of this invention is electrically connected between a source of AC voltage and one or more AC-powered devices, each of which receiving a conditioned AC voltage so as to overcome the adverse effects of a nearby electromagnetic field generated by the presence of a relatively large AC voltage and current.

Figure 2:
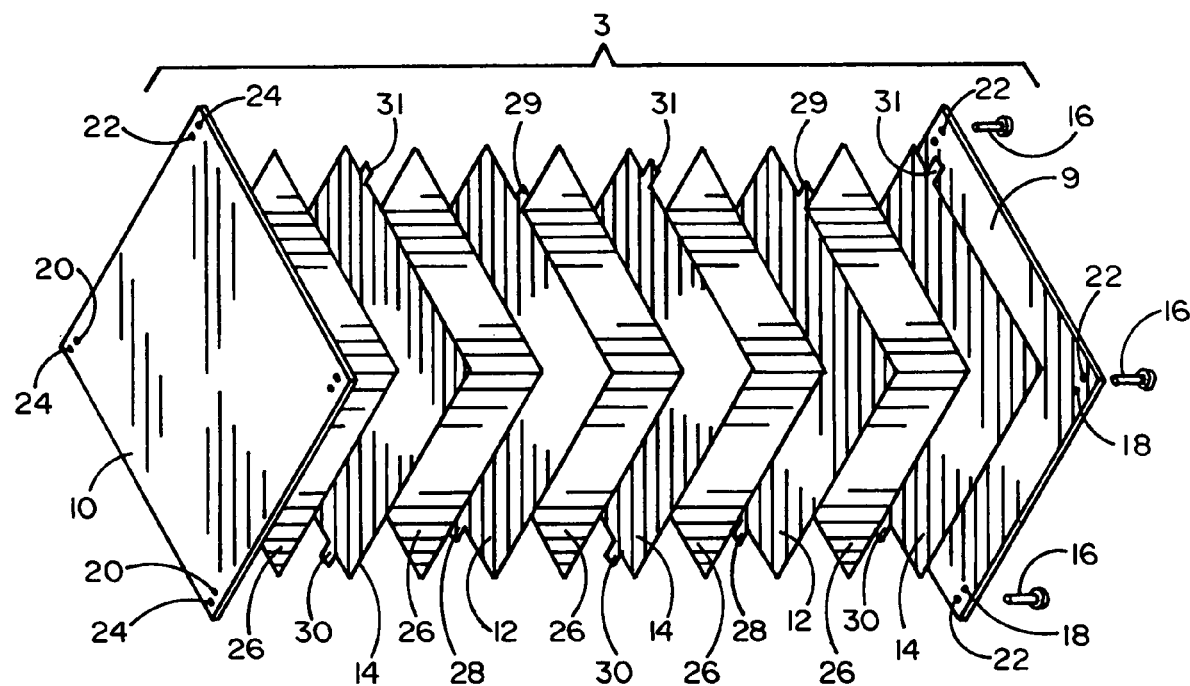
FIG. 2 is an exploded view showing a stack of alternating AC and DC current plates and insulating sheets which form the AC voltage conditioner of FIG. 1.
Figure 3:
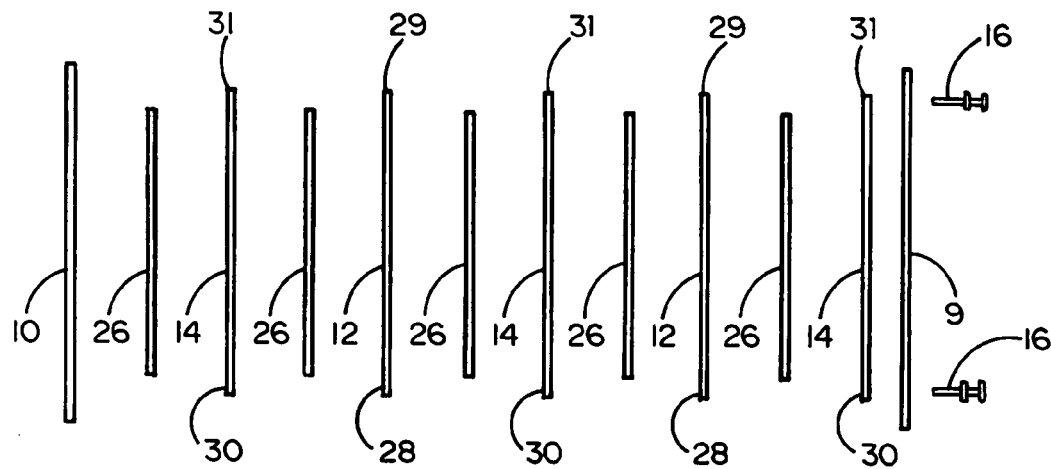
FIG. 3 is a side view of the stack of AC and DC current plates and insulating sheets of FIG. 2.
Figure 4:
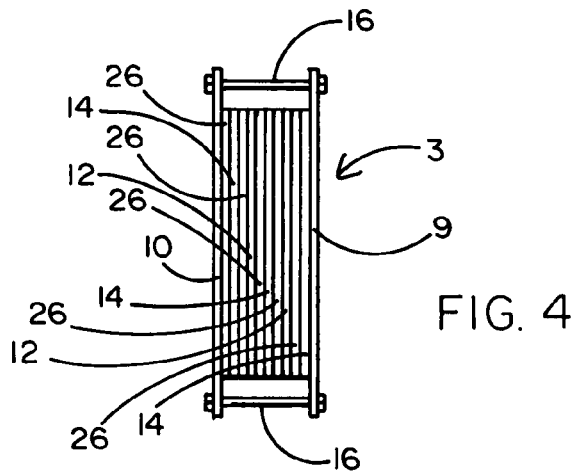
FIG. 4 shows the stack of AC and DC current plates and insulating plates in the assembled relationship sandwiched between top and bottom clamping plates.

Referring concurrently to FIGS. 2-4 of the drawings, there is shown details of the AC voltage conditioner 3 of FIG. 1. The voltage conditioner 3 includes a top clamping plate 9 and an opposing bottom clamping plate 10. Each of the clamping plates 9 and 10 is manufactured from a non-conductive, non-magnetic material. First and second sets of soon-to-be-described AC and DC current plates 12 and 14 are sandwiched between the top and bottom clamping plates 9 and 10. The clamping plates 9 and 10 are preferably taller and wider than the current plates 12 and 14 located therebetween. In the assembled relationship of FIG. 4, electrically non-conductive fasteners 16 extend through pairs of spaced axially-aligned holes 18 and 20 (best shown in FIG. 2) formed through the top and bottom clamping plates 9 and 10 to maintain the sandwiched configuration of current plates 12 and 14.

The top and bottom clamping plates 9 and 10 have additional pairs of spaced axially-aligned holes 22 and 24 (also best shown in FIG. 2) formed therethrough. Such holes will receive respective fasteners (not shown) necessary to mount the AC voltage conditioner 3 within the chassis 1 shown in FIG. 1.

The stack of AC and DC current plates 12 and 14 are preferably rectangular plates that are held together by means of the fasteners 16 so as to lie in spaced parallel alignment with one another between the top and bottom clamping plates 9 and 10. Each current plate 12 and 14 is manufactured from electrically-conductive material, such as copper, aluminum, silver, or the like. The thickness of current plates 12 and 14 is dependent upon the magnitude of the current to be carried thereby. In the presently-described high current embodiment, current plates 12 and 14 have a thickness of approximately 0.005 inches.

A correspondingly sized and shaped insulating sheet 26 is interposed between each successive pair of AC and DC current plates 12 and 14 such that one current plate 12 or 14 is separated and electrically insulated from its adjacent current plate. The insulating sheets 26 may be manufactured from any suitable electrical insulating material, such as that known as Teflon. In the present high current embodiment, the insulating sheets 26 have a thickness of approximately 0.03 inches.

According to the preferred embodiment, the AC voltage conditioner 3 of FIGS. 2-4 includes a total of two AC current plates 12, three DC current plates 14, and five insulating sheets 26. Each insulating sheet 26 is interposed between an AC current plate 12 and an adjacent DC current plate 14. However, it is within the scope of this invention to replace the insulating sheets 26 by air gaps or other electrical insulators, so long as the AC current plates 12 are separated from their adjacent DC current plates 14 by a suitable dielectric.

Figure 4A:
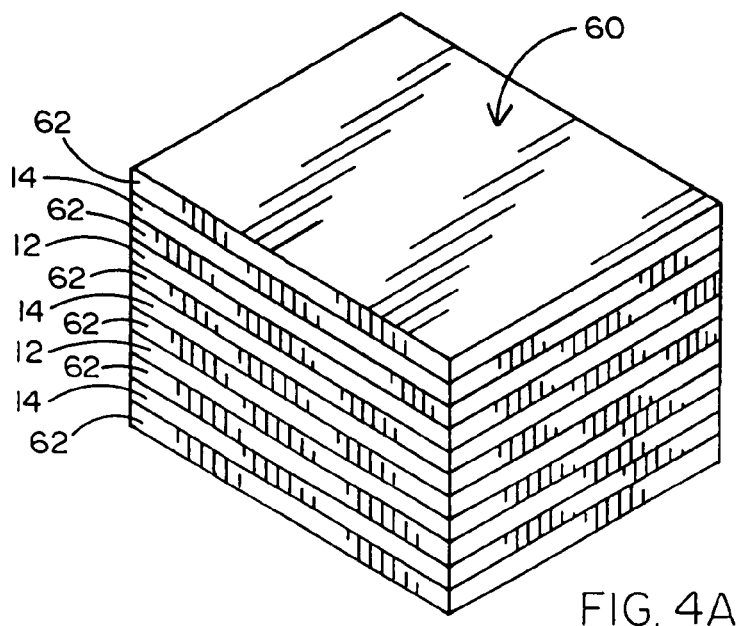
FIG. 4A shows the stack of AC and DC current plates carried by a multilayer circuit board.

FIG. 4 shows the stack of AC and DC current plates 12 and 14 and insulating sheets 26 assembled between the top and bottom clamping plates 9 and 10 of AC voltage conditioner 3. In certain applications, it may be desirable to encapsulate the stack of plates and sheets 12, 14 and 26 within a potting material (not shown) such as an epoxy resin, or the like. In this same regard, and as best shown in FIG. 4A, the AC and DC current plates 12 and 14 can be carried by a multi-layer circuit board 60. In this case, the top and bottom clamping plates 9 and 10 as well as the insulating sheets 26 are eliminated. Each AC and DC current plate 12 and 14 may be an electrically conductive layer that is sandwiched between layers of 62 of non-conducting circuit board material which function as electrical insulators to isolate the conductive layers from one another.

It is desirable that a DC current plate 14 lie in spaced, opposite facing alignment with each side of an AC current plate 12. That is to say, each AC current plate 12 is located between a pair of adjacent DC current plates 14. To accomplish the foregoing, the AC and DC current plates 12 and 14 alternate with respect to one another within the AC voltage conditioner 3 according to the following sequence illustrated by FIGS. 2-4: DC current plate 14, insulating sheet 26, AC current plate 12, insulating sheet 26, DC current plate 14, insulating sheet 26, AC current plate 12, insulating sheet 26, DC current plate 14, and insulating sheet 26.

Each of the AC and DC current plates 12 and 14 includes a pair of electrical terminals 28, 29 and 30, 31 (best shown in FIG. 2). As will now be described while referring to FIG. 5, electrical wires are connected to the terminals 28-31 so that the AC current plates 12 are connected to complete AC current paths and the DC current plates 14 are connected to complete DC current paths. By virtue of the alternativing arrangement of AC and DC current plates 12 and 14 within the AC voltage conditioner 3, an AC current (supplied from a local AC line voltage source) carried by one of the AC current plates 12 will pass through a pair of DC electromagnetic fields that are generated by a DC current (supplied from the DC voltage source 40 of FIG. 1) carried by each one of a pair of DC current plates 14 lying adjacent opposite faces of AC current plate 12.

Figure 5:
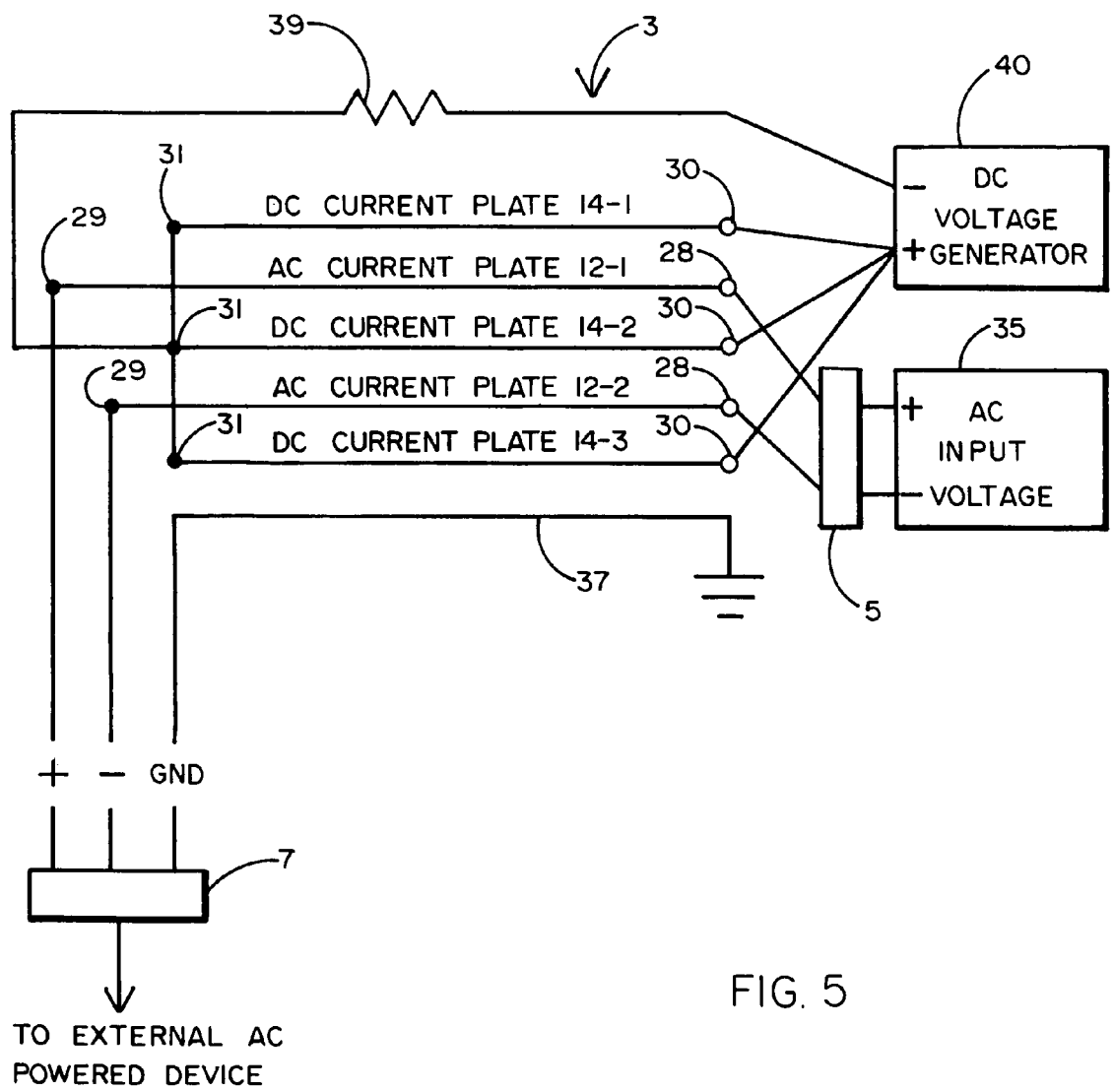
FIG. 5 is illustrative of AC and DC current paths by which an AC or DC current is conducted through each of the AC and DC current plates of FIGS. 2-4.

Turning in this regard to FIG. 5 of the drawings, there is shown the alternating stack of AC and DC current plates 12 and 14 and the AC and DC current paths in which the plates 12 and 14 are connected. More particularly, and as earlier described while referring to FIG. 1, an AC input voltage to be conditioned prior to powering an external AC-powered device is supplied from a source 35 thereof to an input 5 of the chassis 1 in which the AC voltage conditioner 3 is housed. For example, if a 2-wire electrical cord is connected from a 120-volt AC wall receptacle to input 5 of chassis 1, a first (positive) wire is connected to the first terminal 28 of a first AC current plate 12-1 of the voltage conditioner 3, and a second (negative) wire is connected to the first terminal 28 of the second AC current plate 12-2. The second terminal 29 of the first AC current plate 12-1 is connected to one pin of the output 7 of chassis 1, and the second terminal 29 of the second AC current plate 12-2 is connected to the second pin of output 7. In the event the output 7 of chassis 1 will receive a three-pin plug from the external AC device, a ground wire 37 is connected to a ground terminal of output 7 to be coupled to the ground pin of the plug.

A first wire is connected from a first (positive) terminal of the DC voltage generator 40 to the first terminal 28 of a first DC current plate 14-1. As previously indicated, the DC generator 40 may be located inside or outside the chassis 1 in which the AC voltage conditioner 3 is housed. A second wire is connected from the first (positive) terminal of the DC voltage generator 40 to the first terminal 28 of the second DC current plate 14-2. A third wire is connected from the first terminal of the DC voltage generator 40 to the first terminal 28 of the third DC current plate 14-3. A wire is connected from the second (negative) terminal of the DC voltage generator 40, through a suitable load impedance 39, to a common electrical junction at which each of the second terminals 31 of the first, second and third DC current plates 14-1, 14-2 and 14-3 is connected.

Thus, a DC current path is established between the negative and positive terminals of the DC voltage generator 40 by way of impedance 39 and each of the DC current plates 14-1, 14-2 and 14-3. In the example of FIG. 5, the DC current plates are connected in electrical parallel with one another between the common electrical junction formed at respective terminals 31 and the positive terminal of the DC voltage generator 40.

Figure 6:
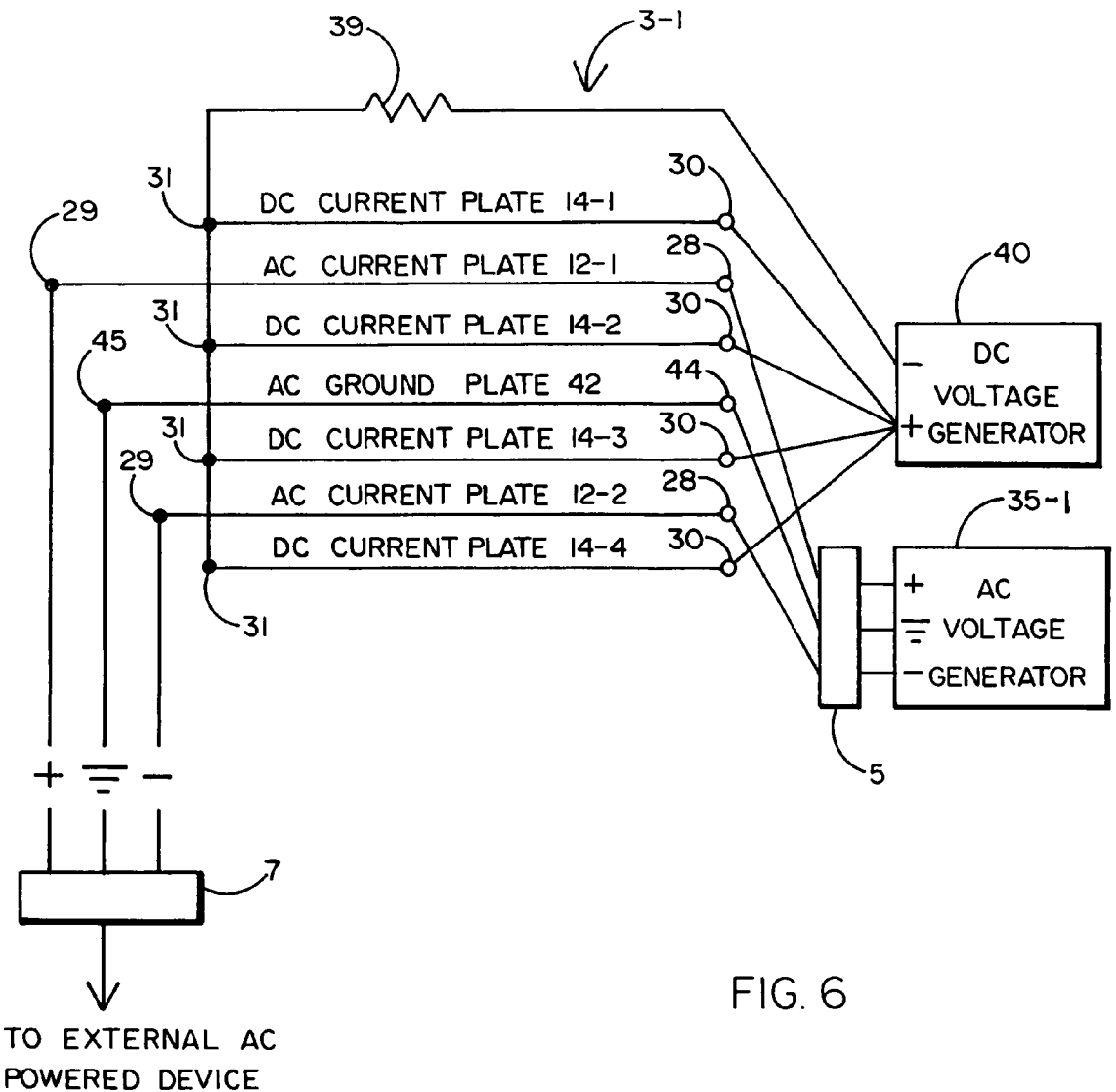
FIG. 6 is illustrative of current paths through a stack of alternating AC and DC current plates and a ground plate which form a modified AC voltage conditioner.

FIG. 6 of the drawings illustrates a modified AC voltage conditioner 3-1. Since some of the current paths and components in the AC voltage conditioner 3-1 of FIG. 6 are the same as those shown in the voltage conditioner 3 of FIG. 5, identical reference numerals are used to indicate such identical features. However, instead of the ground wire 37 of FIG. 5, the AC voltage conditioner 3-1 of FIG. 6 includes the addition of a dedicated ground plate 42. Terminals 44 and 45 of the ground plate 42 are connected between a ground terminal of the AC input voltage source 35-1 and the output 7 of the chassis. This arrangement is particularly advantageous where the plug of the power cord of the external AC powered device to be connected to output 7 has three pins, one pin of which being a ground pin that will lie in electrical contact with the AC ground plate 42.

The AC voltage conditioner 3-1 has the same pair of AC current plates 12-1 and 12-2 as used in the AC voltage conditioner 3. With the addition of the AC ground plate 42, the AC voltage conditioner 3-1 includes a total of four DC current plates 14-1 to 14-4. In this manner, each of the AC current plates 12-1 and 12-2 as well as AC ground plate 42 will be located between a pair of adjacent DC current plates. In particular, the first AC current plate 12-1 lies between DC current plates 14-1 and 14-2, the AC ground plate 42 lies between DC current plates 14-2 and 14-3, and the second AC current plate 12-2 lies between DC current plates 14-3 and 14-4.

Each of the DC current plates 14-1 to 14-4 is connected in electrical parallel with one another between a common electrical junction formed at the respective terminals 31 thereof and the positive terminal of the DC voltage generator 40. As in the case of the AC voltage conditioner 3, the AC voltage conditioner 3-1 of FIG. 6 includes non-conductive sheets or layers or air gaps so that an electrical insulator (not shown) will be interposed between successive ones of the AC and DC current plates 12 and 14 and the AC ground plate 44. Because the currents flowing through AC current plates 12-1 and 12-2 will pass through DC electromagnetic fields generated by the currents flowing through DC current plates 14-1 to 14-4, the advantages provided by the modified AC voltage conditioner 3-1 will be similar to those available from the AC voltage conditioner 3.

That is to say, because each AC current plate 12-1 and 12-2 of AC voltage conditioner 3 is positioned between a pair of adjacent DC current plates 14-1, 14-2 and 14-2, 14-3, the AC currents flowing through the AC current plates 12-1 and 12-2 pass through DC electromagnetic fields created by the currents being carried by the DC current plates 14-1, 14-2 and 14-3. Passing the AC currents through DC electromagnetic fields has been found to reduce the effects of radio frequency interference as well as interference and distortion introduced by AC electromagnetic fields in the vicinity of the AC wall receptacle and occurring in the AC input signal being carried along the power cord. By virtue of the foregoing, the operation of the external AC-powered devices to be powered by the conditioned AC line voltage supplied from the AC voltage conditioner 3 will be improved. By way of particular example, for an audio sound system driven by a 120-volt 60 Hz input available from the usual AC wall receptacle, it has been found that the sound emitted by the system is richer, clearer and fuller when compared with the quality of the sound produced when the AC input voltage was otherwise applied directly to the sound system rather than to the input of the AC voltage conditioner 3 of this invention.

In the preferred embodiment herein disclosed, the AC current plates 12 of the voltage conditioner 3 are connected to a source of AC input voltage. However, the teachings of this invention are also applicable to conditioning any non-linear voltage that is characterized by a pulsing signal. Therefore, the voltage conditioner of this invention may also be connected between any source of non-linear (i.e., variable) AC or DC voltage or digital data and an external device including (but no limited to) a data processing or storage device. In this case, a DC signal will flow through all of the current plates 12 and 14 to the output terminal 7 of the voltage conditioner so that the external device connected to output terminal 7 will receive a conditioned DC signal.

The invention claimed is:

1. An apparatus to be electrically connected between a source of AC voltage and an AC voltage-powered device to improve the performance of said device, said apparatus comprising first and second AC current conductors connected between said source of AC voltage and the AC voltage-powered device so that an AC current flows through each of said first and second AC current conductors; a DC voltage generator; and at least one DC current conductor coupled to said DC voltage generator so that a DC current flows through said DC current conductor, said DC current conductor located between and in proximity to said first and second AC current conductors such that a DC electromagnetic field generated by said DC current flowing through said DC current conductor extends around said first and second AC current conductors, and the AC currents flowing through said first and second AC current conductors pass through said DC electromagnetic field.

2. The apparatus recited in claim 1, wherein the source of AC voltage has a positive output terminal and a negative output terminal and the AC voltage-powered device has a positive input terminal and a negative input terminal, said first AC current conductor to be electrically connected between the positive output terminal of the source of said AC voltage and the positive input terminal of the AC voltage-powered device, and said second AC current conductor to be electrically connected between the negative output terminal of the source of AC voltage and the negative input terminal of the AC voltage-powered device.

3. The apparatus recited in claim 2, further comprising an electrical insulator located between said first and second AC current conductors.

4. The apparatus recited in claim 3, wherein each of said first and second AC current conductors is an electrical current conducting plate and said electrical insulator includes a sheet manufactured from an electrical insulating material and located between said first and second AC current conducting plates.

5. The apparatus recited in claim 4, further comprising first, second and third DC current conducting plates coupled to said DC voltage generator, said first AC current conducting plate located between said first and second DC current conducting plates, and said second AC current conducting plate located between said second and third DC current conducting plates, said second DC current conducting plate being said at least one DC current conductor.

6. The apparatus recited in claim 5, wherein said electrical insulator includes a plurality of electrical insulating sheets, wherein said AC current conducting plates, said DC current conducting plates, and said electrical insulating sheets are arranged in an alternating series one after the other according to a sequence comprising the first DC current conducting plate, a first electrical insulating sheet, the first AC current conducting plate, a second electrical insulating sheet, the second DC current conducting plate, a third electrical insulating sheet, the second AC current conducting plate, a fourth electrical insulating sheet, and the third DC current conducting plate.

7. The apparatus recited in claim 6, further comprising at least one electrically non-conductive fastener extending through said series of alternating AC current conducting plates, DC current conducting plates, and electrical insulating sheets such that said series of plates and sheets are held against one another in a stack.

8. The apparatus recited in claim 7, wherein said stack of alternating AC current conducting plates, DC current conducting plates, and electrical insulating sheets is enclosed by a chassis having an input and an output with said first and second AC current conducting plates electrically connected between said input and said output, the input of said chassis receiving an AC input voltage from the source thereof, and the AC voltage-powered device receiving an AC output voltage from the output of said chassis.

9. The apparatus recited in claim 6, wherein said DC voltage generator is connected to said first, second and third DC current conducting plates to cause a DC current to flow through each of said plates, whereby to generate respective DC electromagnetic fields around each of said first and second AC current conducting plates.

10. The apparatus recited in claim 9, wherein said DC voltage generator has a positive and negative terminal, each of said first, second and third DC current conducting plates connected in electrical parallel with one another between the positive and negative terminals of said DC voltage generator.

11. An apparatus to be electrically connected between a source of AC voltage and an AC voltage-powered device to improve the performance of said device, the source of AC voltage having a positive output terminal and a negative output terminal and the AC voltage-powered device having a positive input terminal and a negative input terminal, said apparatus comprising:
 a first AC current conductor to be electrically connected between the positive output terminal of the source of the AC voltage and the positive input terminal of the AC voltage-powered device;
 a second AC current conductor to be electrically connected between the negative output terminal of the source of AC voltage and the negative input terminal of the AC voltage-powered device;
 first, second and third DC current conductors, said first AC current conductor located between said first and second DC current conductors and said second AC current conductor located between said second and third DC current conductors; and
 a DC voltage generator connected to said first, second and third DC current conductors to cause a DC current to flow through each of said DC current conductors and a corresponding DC electromagnetic field to be formed around each of said DC current conductors,
 whereby AC currents which flow through said first and second AC current conductors pass through the DC electromagnetic fields formed around said DC current conductors.

12. The apparatus recited in claim 11, wherein each of said first and second AC current conductors and said first, second and third DC current conductors is an electrical current conducting plate.

13. The apparatus recited in claim 12, wherein each of the source of AC voltage and the AC voltage-powered device has a ground terminal, said apparatus further comprising an AC ground plate to be connected between the respective ground terminals of the source of AC voltage and the AC voltage-powered device, and a fourth DC current conducting plate, each of said AC current conducting plates and said AC ground plate lying between a different pair of said DC current conducting plates.

14. The apparatus recited in claim 12, further comprising a plurality of electrical insulators, wherein said AC current conducting plates, said DC current conducting plates, and said electrical insulators are arranged in an alternating series one after the other according to a sequence comprising the first DC current conducting plate, a first electrical insulator, the first AC current conducting plate, a second electrical insulator, the second DC current conducting plate, a third electrical insulator, the second AC current conducting plate, a fourth electrical insulator, and the third DC current conducting plate.

15. The apparatus recited in claim 12, wherein said first and second AC current conductors and said first, second and third DC current conductors are layers of a multi-layer circuit board.

16. The apparatus recited in claim 11, wherein said first, second and third DC current conductors are connected in electrical parallel with one another between positive and negative output terminals of said DC voltage generator so as to establish a DC current path through each of said DC current conductors.

17. An apparatus to be electrically connected between a source of non-linear voltage and an output device to improve the performance of the output device, said apparatus including a DC voltage generator, at least one electrical conductor connected between the source of non-linear voltage and the output device so that a variable voltage signal is supplied to the output device through said one electrical conductor, and at least one DC current conductor connected to said DC voltage generator and located in proximity to said one electrical conductor so that a DC current flows through said one DC current conductor by which to generate a DC electromagnetic field around said one electrical conductor, whereby the variable voltage signal being supplied through said one electrical conductor to the output device passes through the DC electromagnetic field generated by the DC current flowing through said one DC current conductor.

* * * * *